US005138230A

United States Patent [19]

Jödicke et al.

[11] Patent Number: 5,138,230

[45] Date of Patent: Aug. 11, 1992

[54] QUASI-OPTICAL GYROTRON HAVING A ROTATABLE MOUNT FOR PROVIDING RESONATOR MIRRORS OF A SELECTED FREQUENCY

[75] Inventors: Bernd Jödicke, Unterehrendingen; Hans-Günter Mathews, Oberehrendingen, both of Switzerland

[73] Assignee: ASEA Brown Boveri Ltd., Baden, Switzerland

[21] Appl. No.: 570,347

[22] Filed: Aug. 21, 1990

[30] Foreign Application Priority Data

Sep. 11, 1989 [CH] Switzerland ........................ 3270/89

[51] Int. Cl.$^5$ ........................ H01J 23/06; H01J 23/20; H01J 23/40; H03B 9/01

[52] U.S. Cl. .......................................... 315/5; 315/39, 315/5.46; 315/5.53; 315/5.29; 315/5.33; 331/79; 333/231

[58] Field of Search ........................ 315/4, 5, 39, 5.53, 315/5.46, 5.29, 5.31, 5.32, 5.33; 331/79; 333/227, 230, 231; 372/2

[56] References Cited

FOREIGN PATENT DOCUMENTS

| | | | |
|---|---|---|---|
| 1426257 | 12/1965 | France . | |
| 664045 | 1/1988 | Switzerland . | |
| 497893 | 8/1978 | U.S.S.R. | 315/4 |

OTHER PUBLICATIONS

The gyrotron, key component for high-power microwave transmitters, H. G. Mathews, Minh Quang Tran, Brown Boveri Review, Jun. 1987, pp. 3–7.

Proceedings of the International Conference on Infared and Millimeter Waves, conf. 12, Orlando, 14–18 Dec. 1987, IEEE (New York, US) T. A. Hargreaves et al.: "The NRL quasi-optical Gyrotron experiment", pp. 238–239.

*Primary Examiner*—Eugene R. LaRoche
*Assistant Examiner*—Benny T. Lee
*Attorney, Agent, or Firm*—Oblon, Spivak, McClelland, Maier & Neustadt

[57] ABSTRACT

In a quasi-optical gyrotron an electron beam (1) passes along an electron beam axis (2) and in so doing is compressed by a static magnetic field and forced into gyration, so that it excites in a quasi-optical resonator a standing alternating electro-magnetic field of given frequency. The resonator exhibits two mirrors (4*a*, 4*b*) arranged opposite to one another on a resonator axis (5) aligned perpendicular to the electron beam axis (2). In order to generate radiation in a wide frequency range, each of the two mirrors (4*a*, 4*b*) of the resonator is arranged in each case on a movable mount (8*a*, 8*b*) together with at least one further mirror (4*c*, 4*d*). In order to set a specific frequency of the alternating field, it is possible for two mirrors (4*c*, 4*d*), corresponding to one another and tuned to the desired frequency, to be brought onto the resonator axis by actuating the movable mounts (8*a*, 8*b*). Up to six mirrors are preferably attached to a revolver-type rotatable mount which is rotatable about an axis of rotation parallel to the resonator axis.

7 Claims, 1 Drawing Sheet

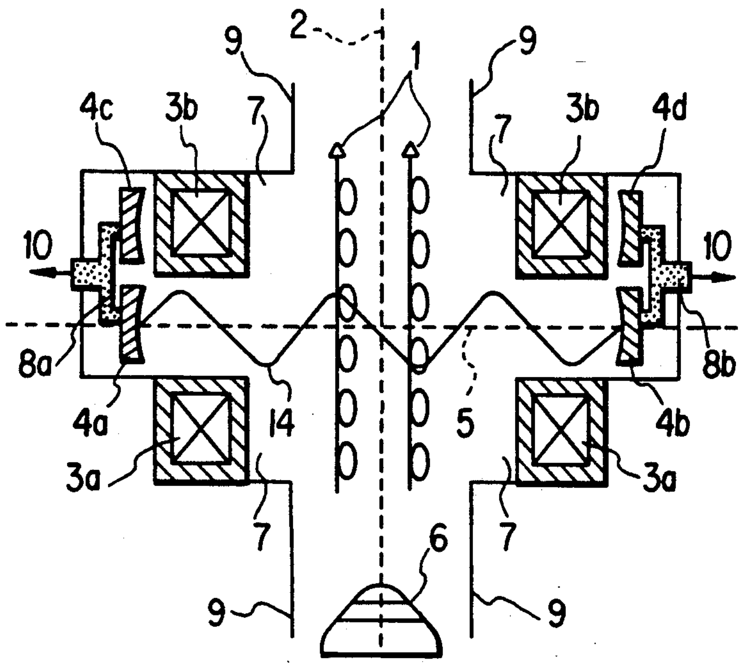
FIG.1
FIG.2
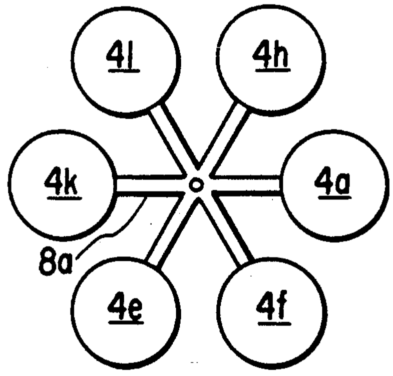
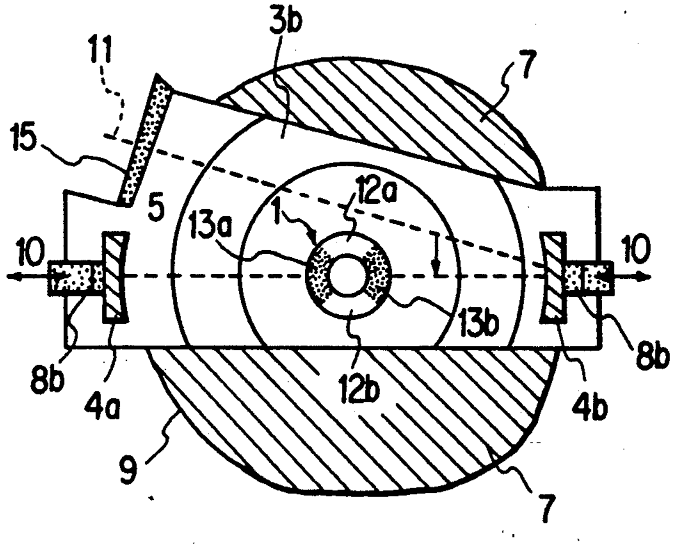
FIG.3

QUASI-OPTICAL GYROTRON HAVING A ROTATABLE MOUNT FOR PROVIDING RESONATOR MIRRORS OF A SELECTED FREQUENCY

BACKGROUND OF THE INVENTION

1. Field of the Invention

The invention relates to a quasi-optical gyrotron comprising a) first means for generating an electron beam passing in the direction of an electron beam axis, b) second means for generating a static magnetic field, which is aligned parallel to the electron beam axis and through which the electron beam is compressed and forced into gyration, c) a quasi-optical resonator, which exhibits two mirrors arranged opposite to one another on a resonator axis aligned perpendicular to the electron beam axis, in which resonator an alternating electromagnetic field of given frequency is excited by the gyration of the electron beam, and d) third means for coupling out electromagnetic radiation from the resonator.

2. Discussion of Background

A quasi-optical gyrotron of the type initially mentioned is known, for example, from the Patent CH-664045 or from the article "Das Gyrotron, Schlüsselkomponente fr Hochleistungs-Mikrowellensender" (The gyrotron, key component for high-power microwave transmitters), H. G. Mathews, Minh Quang Tran, Brown Boveri Review 6-1987, pages 303 to 307. Such a gyrotron operates at frequencies of typically 150 GHz and above and is capable of generating radiant powers of a few 100 kW in continuous-wave operation.

The gyrotron is a high-power microwave tube for heating fusion plasmas. Since the current fusion installations are experimental installations, it is desirable for it to be possible to tune the frequency of the transmitter over a sizeable frequency range.

In the case of all previously known high-power gyrotrons having a resonator, the useful oscillation bandwidth is approximately 10–20%. In the case of sizeable deviations of the oscillation frequency from the optimum frequency, efficiency becomes extremely low.

One possibility of extending the frequency range of conventional, quasi-optical gyrotrons is the use of crossed resonators, as is proposed in Swiss patent application CH-1490/89. A principal advantage of the crossed resonators is the possibility of switching over from one frequency to double that frequency within a short period (of less than 1 sec). This is achieved when the resonator geometry is chosen such that the optimum oscillation range of the second resonator (for the same beam parameters) is exactly double the frequency of the first. There is also the possibility of choosing two independent frequencies. In this case, it is also necessary to change the magnetic field (field strength) as well as the resonator.

The solution with the crossed resonators is not, however, capable of covering a sufficiently wide frequency range.

Moreover, attempts have been made for some time to improve the efficiency of the gyrotron by means of so-called sheet-beam guns. A sheet-beam gun optimized for the quasi-optical gyrotron with its cylindrical symmetry is described, for example, in U.S. patent application Ser. No. 07/570,794. The advantage of such an electron gun consists in that the current density in the resonator is kept small in the nodal surfaces of the alternating electromagnetic field, so that the kinetic energy of the electrons is converted as completely as possible into radiant energy. However, it happens that in the case of a crossed resonator the sheet-beam gun cannot display its advantages, because of the different orientation of the nodal surfaces in the various resonators.

SUMMARY OF THE INVENTION

Accordingly, one object of this invention is to provide a novel quasi-optical gyrotron of the type initially mentioned, constructed in such a way that it can cover a wide frequency range, which range is desirable, in particular, in experimental installations, and at the same time is also suitable for the use of sheet-beam guns.

According to the invention, the solution consists in that each of the two mirrors of the resonator is arranged in each case on a movable mount together with at least one further mirror, and in that in order to set a specific frequency of the alternating field, two mirrors corresponding to one another and tuned to the desired frequency can be brought onto the resonator axis by actuating the movable mounts.

For reasons of space, it is particularly advantageous to arrange the mirrors on a rotatable mount whose axis of rotation is parallel to the resonator axis.

If, in accordance with a particularly preferred embodiment, the mount is equipped, in the manner of a revolver, with up to six mirrors, the gyrotron can cover in a mechanically simple and space-saving fashion a frequency range that is sufficiently large for most applications.

Cooling the mirrors permits the generation of the highest radiant powers. In accordance with an advantageous embodiment of the invention, feeding of the coolant is done through the axis of rotation of the movable mount.

Two pairs of mirrors which are arranged on a slide-like or revolver-like mount, suffice for a particularly simple embodiment.

It is advantageous if the third means for coupling out electromagnetic radiation comprises at least one hologram which is applied in each case on a reflecting surface of one of the two mutually corresponding mirrors, so that the radiation to be coupled out is deflected in the direction of at least exactly one coupling-out axis, the at least one coupling-out axis enclosing with the resonator axis a predetermined angle greater than zero. Apart from coupling out the radiation in the desired form of a Gaussian distribution which yields a radiation pattern with no side lobes waves, such an embodiment permits a mechanically stable and unproblematical configuration of the mount.

The coupling-out axis and the resonator axis essentially lie in a common plane, which is perpendicular to the electron beam axis.

With regard to high efficiency, the first means for generating an electron beam advantageously comprises a sheet-beam gun.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a diagrammatic representation of a quasi-optical gyrotron in longitudinal section;

FIG. 2 shows a diagrammatic representation of a revolver-like mount having six mirrors; and FIG. 3 shows a diagrammatic representation of a resonator with holographic coupling out.

DESCRIPTION OF THE PREFERRED EMBODIMENTS

Referring now to the drawings, wherein like reference symbols designate identical or corresponding parts throughout the several views, FIG. 1 shows diagrammatically the parts of a quasi-optical gyrotron according to the invention which are essential for explaining the invention. Said gyrotron comprises an explaining the invention. The gyrotron comprises an electron-beam gun 6 for generating an, for example, angular electron beam 1, which passes along an electron beam axis 2. Both a well-known magnetron-injection gun and a preferred sheet-beam gun are suitable as the electron-beam gun 6. Two coils 3*a*, 3*b* in Helmholtz arrangement (i.e. they essentially have a mutual distance corresponding to their radius) generate a static magnetic field parallel to the electron beam axis 2, so that the electron beam 1 is compressed and forced into gyration.

A quasi-optical resonator formed by two mirrors 4*a*, 4*b* arranged opposite to one another on a resonator axis 5 is arranged between the two coils 3*a*, 3*b* such that its resonator axis 5 is aligned perpendicular to the electron beam axis 2.

The mutually corresponding mirrors 4*a*, 4*b* are optimized to a specific frequency. They are, for example, spherically curved and have the form of a circular disk.

Owing to the gyration of the electrons, a high-frequency alternating electromagnetic field 14 is excited in the resonator, so that the desired electro-magnetic radiation can be coupled out from the resonator with suitable means and transmitted to a load through an RF window and, possibly, a waveguide. The RF window (not to be seen in FIG. 1) seals off an evacuated vessel 9, in which the described parts are accommodated, transparently with respect to the outside (e.g. a waveguide).

The two coils 3*a*, 3*b*, which exert strong forces on one another, are mutually supported with the aid of a support structure 7. The support structure 7 includes suitable bores or clearances for the resonator. The support structure 7 can, for example, be a steel girder provided with bores, or a supporting frame of suitably arranged titanium bars. The whole is accommodated in an evacuated vessel 9.

The parts of the gyrotron so far described are sufficiently known (e.g. from the prior art initially quoted). Accordingly, a detailed explanation can be dispensed with here.

By contrast, the configuration of the resonator for generating various frequencies is new.

According to the invention, the gyrotron therefore comprises at least two further, mutually corresponding mirrors 4*c*, 4*d*, which are arranged together with the two mirrors 4*a*, 4*b* on a movable mount 8*a*, 8*b* in each case. The further mirrors 4*c*, 4*d* are tuned to a different frequency from the first two mirrors 4*a* and 4*b*. However, they are otherwise constructed in an analogous fashion.

The two mounts 8*a*, 8*b* are preferably rotatable about an axis parallel to the resonator axis 5, to be precise in such a way that the two further mirrors 4*c* and 4*d* can be brought to the position of the first two mirrors 4*a*, 4*b*. It goes without saying that means must be provided which guarantees that the pair of mirrors located in each case on the resonator axis 5 can be exactly aligned (centered) and fixed (locked).

In order to switch the gyrotron over from one frequency to another, the two mounts 8*a*, 8*b* are rotated so that the mirrors 4*a*, 4*b* are exchanged for the mirrors 4*c*, 4*d*. At the same time, the magnetic field is tuned to the new frequency by an increase or reduction in the coil current in the coils 3*a*, 3*b*.

In accordance with a preferred embodiment, the mirrors 4*a*, 4*b*, 4*c*, 4*d* are cooled by means of a coolant 10. The feeding of the coolant is done through the axis of rotation of the mount 8*a* and 8*b*, respectively.

Naturally, what has been said for the sake of simplicity regarding just two pairs of mirrors 4*a*, 4*b* and 4*c*, 4*d* respectively also holds for three and more pairs or mirrors. In particular, it applies to one preferred embodiment when up to six mirrors are arranged on a mount.

FIG. 2 shows a mount 8*a*, on which six mirrors 4*e*, 4*f*, 4*g*, 4*h*, 4*j*, 4*k* are attached in the form of a revolver. In the present example, the mirrors 4*e*, 4*f*, 4*g*, 4*h*, 4*j*, 4*k* are held by individual arms, which have a mutual distance of 60°.

The coupling out of the electromagnetic radiation can be done in various ways, which are, however, known per se. One possibility consists in providing the mirrors with suitable coupling-out slots in each case. Another possibility is provided by coupling out at the rim of a mirror. In this case, one of the two mutually corresponding mirrors has in each case a diameter that is somewhat smaller than the other.

It is particularly advantageous to couple out the desired electromagnetic radiation with the aid of holographic structures. This is to be explained in more detail below.

FIG. 3 shows a section through a resonator such as has been shown already in principle in FIG. 1. In both figures, corresponding parts are provided with like reference symbols. In the representation of FIG. 3, the electron beam 1 passes away from the observer. The coil 3*b* is to be recognized behind the support structure 7.

The surface of the mirror 4*b* is provided with a hologram, which has the effect that a small portion of energy of the alternating field is coupled out along a coupling-out axis 11. The coupling-out axis 11 encloses with the resonator axis 5 a predetermined angle greater than zero.

The angle $\alpha$ is typically of the order of magnitude of 30°. A RF window 15 emits the desired radiation, and closes the vessel 9 in a vacuum-tight fashion.

Details concerning the holographic coupling out are to be gathered from U.S. patent application Ser. No. 07/553,606.

The advantage of the holographic coupling out resides principally in that a Gaussian beam can be coupled out exactly in a predetermined direction. To be precise, only a Gaussian beam can be transported without loss over a lengthy distance.

However, the holographic coupling out has still further advantages in connection with the invention. To be precise, whereas in the case of coupling out through slots or at the rim of the mirror the radiation is emitted along the resonator axis, the mount necessarily coming to lie in the beam path, when holograms are used the coupling-out is, as it were, locally separated from the resonator. Correspondingly, in this case there is no need to ensure that the coupled-out radiation is hindered as little as possible by the mount (as is the case with the other embodiments). The mount can thus be installed simply and without any problem.

A further advantageous embodiment arises when a sheet-beam gun is used instead of a conventional electron-beam gun 6 with an annular electron beam 1. Said sheet-beam gun possesses an annular cathode, which is constituted such that the electron beam 5 has an azimuthally varying current density. To be precise, the current density is relatively low in the nodal surfaces of the standing alternating field 8 in the resonator, and high in the antinodes, i.e. in the regions of high electric field strength. For this purpose, the cathode has a plurality of segments of alternately high and low emitting power as disclosed in U.S. application Ser. No. 07/570,794.

The sheet beam gun above described is indicated in FIG. 3. In correspondence with the cathode, the electron beam 1 exhibits, for example, two segments of low current density 12*a*, 12*b* and two segments of high current density 13*a*, 13*b*, in each case. As already indicated, the segments of low current density 12*a*, 12*b* are constructed and aligned such that they produce in the resonator a relatively low current density in the nodal surfaces of the standing alternating field 8.

The segments are essentially produced when a periodic pattern of parallel strips (corresponding to the amplitude pattern of the alternating electro-magnetic field) is superimposed on a circular ring (corresponding to the cathode). In this arrangement, the pattern preferably has a period corresponding to the product of half the wavelength times the root of the compression factor. Here, the compression factor specifies the ratio of the strength of the magnetic field at the location of the resonator (interaction zone) to that at the location of the electron emitter (cathode).

In the illustrative embodiment described, the electron beam is composed of two sheet beams. Of course, what has been said also holds for n-fold sheet beams. Details on the sheet-beam gun are to be gathered from U.S. patent application Ser. No. 07/570,794.

The aim below is to provide further briefly a few variants of the described illustrative embodiments.

The mount which holds the mirrors in the form of a revolver, need not necessarily exhibit individual arms. With regard, in particular, to the coupling-out through slots of the mirrors or to holographic coupling-out, said mount can be embodied as a massive, rotatable disk. In this way, any possible cooling, as shown schematically by means of a coolant 10 shown in FIGS. 1 and 3, can be effected particularly simply and efficiently.

The mount is preferably motor driven and locked automatically. Micrometer screws, for example, are to be provided for fine adjustment of the mirrors.

The mirrors can be separate elements which have been subsequently fastened to the mount, or integrated components of the mount (e.g. in the case of a massive disk).

Of course, apart from a cylindrical sheet-beam gun a linear sheet-beam gun is also suitable for enhancing the efficiency. In the case of linear sheet-beam guns, the individual sheet beams pass essentially in a common, suitably aligned plane.

It may be said in summary that the invention represents a simple possibility of increasing the frequency range of known quasi-optical gyrotrons.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A quasi-optical gyrotron comprising:
   a) an evacuated gyrotron chamber with a gyrotron main axis;
   b) first means for emitting a beam of electrons along an electron beam axis aligned parallel to said gyrotron main axis;
   c) second means aligned along said gyrotron main axis for generating a static magnetic field aligned parallel to said electron beam axis forcing said electron beam into gyration;
   d) a quasi-optical resonator, aligned along said gyrotron main axis, including at least a first pair of mirrors arranged opposite to one another on a resonator axis aligned perpendicular to said electron beam axis, said electron beam exciting an electromagnetic alternating field of a given frequency by gyration in said quasi-optical resonator;
   e) third means, coupled to said quasi-optical resonator, for coupling out electromagnetic radiation of said electromagnetic alternating field from said quasioptical resonator;
   f) said first pair of mirrors mounted on a movable mount rotatable about an axis of rotation aligned perpendicular to said electron beam axis;
   g) a second pair of mirrors arranged opposite to one another and mounted on said movable mount;
   h) each of said first or second pairs of mirrors being tuned to a respective specific frequency; and
   i) said movable mounts being turnable about said axis of rotation so that a specific frequency of said electromagnetic alternating field can be set by bringing a selected pair of said first or second pairs of mirrors onto said resonator axis.

2. The quasi-optical gyrotron as claimed in claim 1 wherein said third means comprises at least one hologram structure arranged on a reflecting surface of one of the mirrors of said quasioptical resonator, said electromagnetic radiation being coupled out along at least one coupling out axis having a direction which makes an angle with said resonator axis other than zero.

3. The quasi-optical gyrotron as claimed in claim 2, wherein said coupling-out axis and said resonator axis lie in a common plane, which is essentially perpendicular to said electron beam axis.

4. The quasi-optical gyrotron as claimed in claim 1 wherein said means for emitting said electron beam comprises a sheet-beam gun which emits at least tow sheet electron beams.

5. A quasi-optical gyrotron as claimed in claim 1 wherein
   a) said second means for generating said static magnetic field comprises two coils arranged on said electron beam axis in Helmholtz arrangement,
   b) said quasi-optical resonator is accommodated between the two coils, and c) said resonator axis and said coupling-out axis lie in a common plane perpendicular to said electron beam axis.

6. The quasi-optical gyrotron as claimed in claim 1, further comprising:

third through sixth pairs of mirrors arranged opposite to one another on said rotatable movable mount.

7. The quasi-optical gyrotron as claimed in claim 6, wherein said mirrors are each cooled by means of a coolant fed through said axis of rotation of said rotatable movable mount.

* * * * *